(12) United States Patent
Frosien et al.

(10) Patent No.: US 7,335,894 B2
(45) Date of Patent: Feb. 26, 2008

(54) HIGH CURRENT DENSITY PARTICLE BEAM SYSTEM

(75) Inventors: Juergen Frosien, Riemerling (DE); Stefan Lanio, Erding (DE); Gerald Schoenecker, Munich (DE); Alan D. Brodie, Palo Alto, CA (US); David A. Crewe, Sunnyvale, CA (US)

(73) Assignee: ICT Integrated Circuit Testing Gesselschaft, Heimstetten (DE)

( * ) Notice: Subject to any disclaimer, the term of this patent is extended or adjusted under 35 U.S.C. 154(b) by 254 days.

(21) Appl. No.: 11/274,608

(22) Filed: Nov. 15, 2005

(65) Prior Publication Data
US 2006/0151711 A1    Jul. 13, 2006

(30) Foreign Application Priority Data
Nov. 15, 2004   (EP)   ................................. 04027115

(51) Int. Cl.
*H01J 37/244* (2006.01)
(52) U.S. Cl. .................... 250/396 R; 250/310
(58) Field of Classification Search ............ 250/396 R, 250/396 ML, 310
See application file for complete search history.

(56) References Cited

U.S. PATENT DOCUMENTS

| 3,761,707 | A | | 9/1973 | Liebl |
| 4,810,883 | A | | 3/1989 | Turner |
| 5,321,262 | A | | 6/1994 | Turner |
| 6,037,586 | A | * | 3/2000 | Baril ......................... 250/287 |
| 6,218,663 | B1 | | 4/2001 | Nisch et al. |

FOREIGN PATENT DOCUMENTS

| EP | 0 458 498 A2 | 11/1991 |
| EP | 1 432 008 A1 | 6/2004 |
| EP | 1 463 087 A1 | 9/2004 |

OTHER PUBLICATIONS

European Patent Office Search Report dated Jun. 10, 2005.

* cited by examiner

*Primary Examiner*—Kiet T. Nguyen
(74) *Attorney, Agent, or Firm*—Patterson & Sheridan L.L.P.

(57) ABSTRACT

The present invention relates to a charged particle unit for deflecting and energy-selecting charged particles of a charged particle beam. Thereby, a double-focusing sector unit for deflecting and focusing the charged particle beam and an energy-filter forming a potential is provided, whereby charged particles of the charged particles beam are redirected at the potential-saddle depending on the energy of the charged articles.

27 Claims, 16 Drawing Sheets

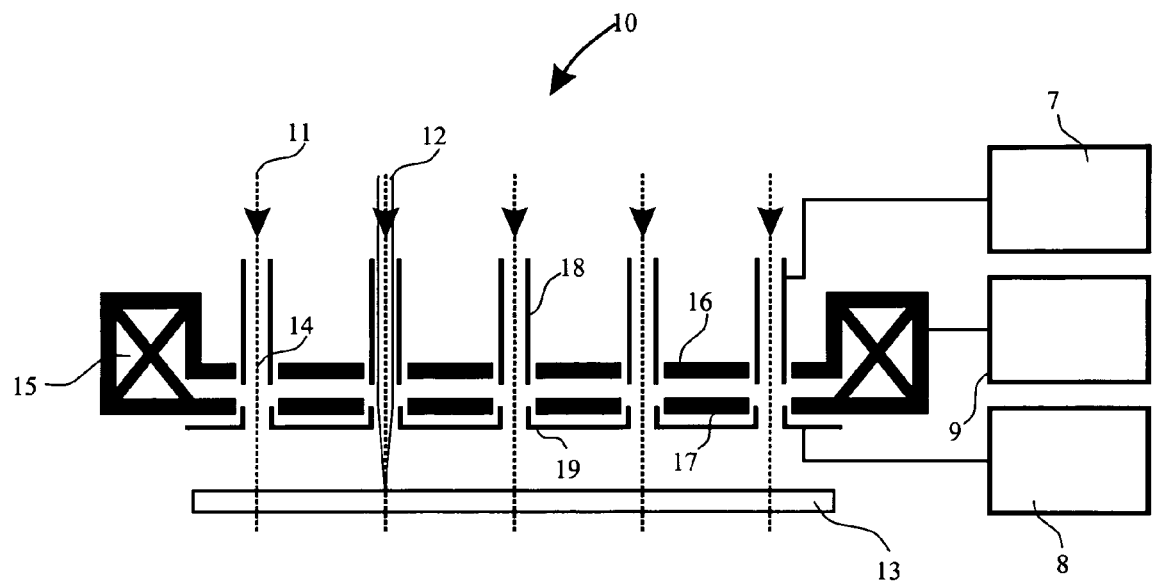
Fig.11
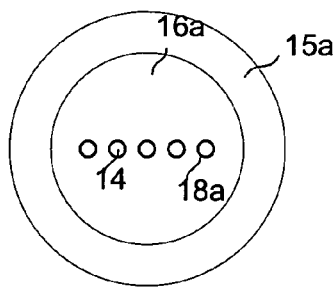 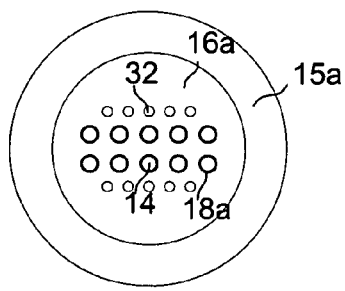 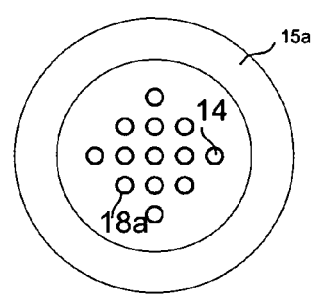
Fig.12a  Fig.12b  Fig.12c

HIGH CURRENT DENSITY PARTICLE BEAM SYSTEM

CROSS-REFERENCE TO RELATED APPLICATIONS

This application claims foreign priority benefits under 35 U.S.C. §119 to co-pending European patent application number EP 04027115.7, filed 15 Nov. 2004. This related patent application is herein incorporated by reference in its entirety.

BACKGROUND OF THE INVENTION

Field of the Invention

The invention relates to charged particle beam devices for inspection system applications, testing system applications, lithography system applications, and the like. It also relates to methods of operation thereof. Further, the present invention relates to applications having a charged particle path with high-speed energy filter, e.g. for electron beam inspection (EBI). Specifically, the present invention relates to charged particle units, to charged particle detection devices, a charged particle beam device, a charged particle multi-beam device and methods of operating theses devices.

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring, is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

Besides resolution, throughput is an issue of such devices. Since large substrate areas have to be patterned or inspected, throughput of, for example, larger than 10 $cm^2$/min are desirable. In charged particle beam devices, the throughput depends quadratically on the image contrast. Thus, there is a need for contrast enhancement.

Generally, for the following discussion, there is no need for distinguishing between secondary electrons, backscattered electrons and Auger electrons. Therefore, the three types together, for simplicity, will be referred to as "secondary electrons".

High resolution electron optics systems require a short working distance between the objective lens and the wafer. Secondary electron collection is therefore typically done inside the column above the objective lens. A configuration commonly found in prior-art electron-beam imaging systems is shown schematically in FIG. 1. A column 100, comprising an emitter 105, an objective lens 110 and an annular secondary-electron detector 115, are spaced at a working distance 120 from a specimen 125. Primary electron beam 130 from emitter 105 is directed at specimen 125 through an opening 135 in annular detector 115. Secondary electrons 140 are emitted from specimen 125 in a broad cone surrounding primary beam 130. Some of secondary electrons 140 are collected by detector 115 to produce a secondary-electron (SE) signal 145.

A limitation of this approach is that a fraction of the secondary electrons travel back through opening 130 toward emitter 105 and therefore miss the active detection area of detector 115. This is particularly true when imaging conditions require the use of an electric field between the column and the specimen in order to extract secondary electrons from the bottom of deep structures (e.g. contact holes in an in-process semiconductor wafer).

A further limitation of such a configuration is that the imaging conditions of the primary electron beam affect the secondary electron beam and vice-versa. For instance, if one were to want to energy filter the secondary beam (through the use of retarding grids, for example) this would have a deleterious effect on the primary beam optics.

An improved particle-beam column having a short working distance and compact design is desired, for example, to enable fast and high-quality imaging of samples. Thereby, it is further intended to provide an analyzing system and a charged particle beam device which provides contrast enhancement.

SUMMARY OF THE INVENTION

The present invention provides an improved charged particle system. According to aspects of the present invention, a charged particle unit, a charged particle detection device, a charged particle beam device, a charged particle multi-beam device and a method of detecting secondary charged particles are provided.

Further advantages, features, aspects and details of the invention are evident from the dependent claims, the description and the accompanying drawings.

According to one aspect a charged particle unit for deflecting and energy-selecting charged particles of a charged particle beam is provided. The unit comprises a double-focusing sector unit for deflecting and focusing the charged particle beam into an energy-filter. The energy-filter forms a potential-hill (potential-saddle), whereby charged particles of the charged particles beam are redirected at the potential-hill (potential-saddle) depending on the energy of the charged particles.

In view of the focusing behavior of the double focusing sector unit the divergence of charged particles is reduced. Thereby, the charged particles can be fast and efficiently guided to another unit, e.g. a detector. The high transparency achieved thereby may advantageously be used for speeding up imaging, inspection, testing processes or the like.

According to another aspect, the double-focusing sector unit is provided in the form of a sector for focusing in a first dimension and a quadrupole unit or cylinder lens for focusing in a second direction, or in the form of a double focusing sector unit comprising a hemispherical sector; or in the form of one of the above mentioned sectors in combination with a further lens unit.

According to another aspect of the present invention the energy-filter has a biased electrode comprising one aperture for letting the charged particle beam pass through. Typically, the aperture may be provided in form of a biased cylinder.

Having the majority of charged particles pass through one aperture avoids grid-lines or the like. Thereby, the transparency of the system is increased.

According to another aspect the deflection and filtering unit is used as a detection device for secondary charged particles.

According to a yet further aspect the secondary charged particles released from a specimen are accelerated towards the double-focusing sector unit by an acceleration unit.

Thereby, the collection efficiency, and transparency can be further increased to speed up imaging, inspection and/or testing. This acceleration unit can be an electrode in the column or a biased component of the charged particle beam device, typically a part of the objective lens, the column housing or the like. Thereby, according to a further option a proximity electrode may be provided adjacent to the specimen. Such an electrode can reduce or control the influence of the accelerating unit on released secondary particles.

The above-mentioned acceleration unit is biased relative to the wafer potential. That is, it can either be biased to a potential while the wafer is on ground potential, it can be grounded while the wafer is biased to a different potential, or both parts can be biased to obtain a desired potential difference.

According to an even further aspect the deflection and energy-selecting unit and/or the detection device is utilized for a charged particle beam device or a multi-charged particle beam device.

According to another aspect a charged particle detection device is provided. The device for detecting charged particles released from a specimen on impingement of a primary charged particle beam, the primary charged particle beam being focused on the specimen by a focusing element, comprises: a focusing unit positioned outside the focusing area of the focusing element for reducing divergence of a secondary charged particle beam released from a specimen; a filter for re-directing a portion of the secondary charged particle beam away from a detector, whereby the portion of the secondary charged particles comprises the charged particles with an energy below a selectable energy threshold value; and the detector for producing a detection signal corresponding to the incidence of the secondary charged particle beam; whereby the filter is suitable for forming a single potential saddle acting on the charged particle beam.

Thereby, the detection efficiency can be increased. Resulting therefrom, a high speed charged particle device can be provided.

According to a further aspect, the device is provided, whereby the focusing unit is adapted to focus the beam of secondary charged particles within the filter. Thereby, the filter dependency of the beam divergence can be reduced and the transparency of the filter can be further increased.

According to another aspect, a device further comprising a deflection angle increasing unit for increasing the angle of separation of the secondary charged particle beam from the primary charged particle beam is provided. The deflection angle increasing unit is provided in the form of a sector, the sector focusing the secondary charged particle beam in the plane of deflection. Alternatively, the deflection angle increasing unit is provided in the form of a hemispherical sector, the sector focusing the secondary charged particle beam in at least two planes perpendicular to each other. Further, a sector can be utilized as a (first) part of the focusing unit.

According to other aspects, charged particle beam devices, charged particle multi-beam devices including one of the above mentioned detection devices are provided. Further a method for detecting secondary charged particle beams is provided.

The invention is also directed to apparatuses for carrying out the disclosed methods, including apparatus parts for performing each of the described method steps. These method steps may be performed by way of hardware components, a computer programmed by appropriate software, by any combination of the two, or in any other manner.

BRIEF DESCRIPTION OF THE DRAWINGS

Some of the above indicated and other more detailed aspects of the invention will be described in the following description and partially illustrated with reference to the figures. Therein:

FIG. 11 shows a schematic side view of an objective lens that can be utilized in a multi-beam device according to the invention;

FIGS. 12a to 12c show schematic top views of objective lenses that can be utilized in a multi-beam device according to the invention and the corresponding beam patterns;

DETAILED DESCRIPTION

Without limiting the scope of protection of the present application, in the following the charged particle beam device or components thereof will exemplarily be referred to as an electron beam device or components thereof. Thereby, the electron beam might especially be utilized for inspection or lithography. The present invention can still be applied for apparatuses and components using other sources of charged particles and/or other secondary and/or backscattered charged particles to obtain a specimen image.

The present invention relates to particle beam inspection systems having typically high probe currents as well as typically a high detection efficiency and, resulting therefrom, high detection speeds. Specifically, the present invention relates to electron beam systems.

Within the following description of the drawings, the same reference numbers refer to the same components. Generally, only the differences with respect to the individual embodiments are described.

Generally, when referring to focusing a charged particle beam for a further energy-selection step, it is understood that the beam of charged particles is reduced in divergence such that the filtering step can be conducted with an increased transparency. This means, the charged particles of a beam are focused or at least collimated towards the energy-selection unit to decrease losses of charged particles due to divergence or due to blocking of charged particles.

To increase the collection efficiency and/or allow for the use of energy filters or SE optics enhancements the primary electron beam and secondary electron beams should be separated. Once separated, focusing and filtering optics for the secondary electron beam can be devised which have no effect on the primary electron beam.

There are two principle methods for separating the primary and secondary electron beams, both of which take advantage of the fact that the force on a moving electron traversing a magnetic field is dependent upon the electron's velocity. This is a fundamental principle described by the Lorentz force law.

Since the primary electrons and secondary electrons are essentially traveling in opposite directions, the force acting upon the two bundles will be opposite in direction when traveling through a transverse magnetic field.

Figure 2A:
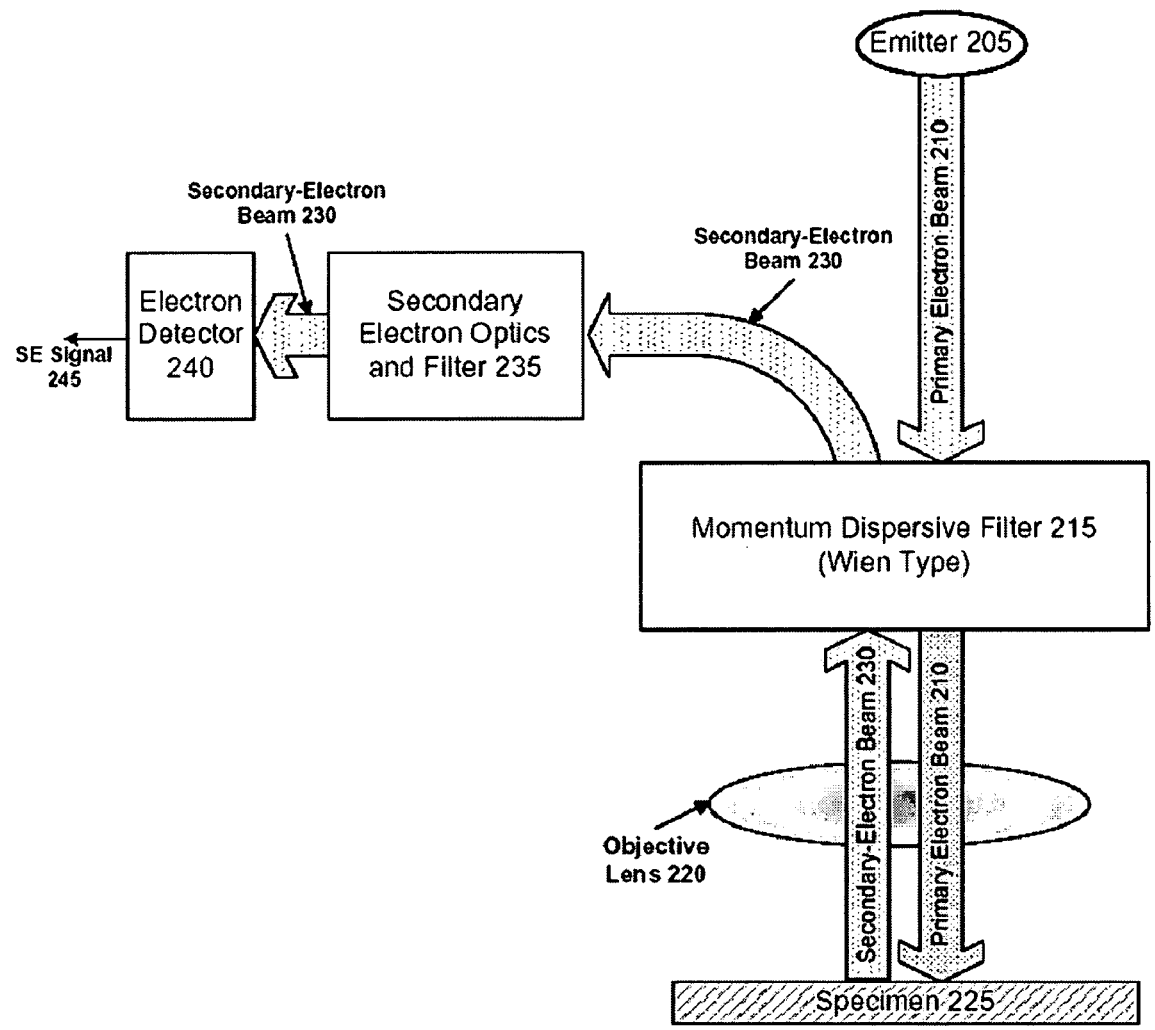
FIG. 2a shows a schematic view of a system according to the present invention with a Wien filter type separating unit.

One possible beam separator is the Wien filter. A Wien filter arrangement in accordance with an embodiment of the invention is shown schematically in FIG. 2a. An emitter 205 emits a primary-electron beam 210 which passes through Wien-type momentum-dispersive filter 215 and is focused by objective lens 220 on a sample 225. Secondary-electron beam 230 passes through objective lens 200 and Wien-type filter 215 in a direction opposite to that of primary-electron beam 210. The Wien filter can be adapted such that the primary-electron beam 210 passes unaffected by Wien filter 215, while secondary-electron beam 230 is bent as it passes through Wien filter 215 so that it exits the column inclined with respect to primary-electron beam 210. Once separated from the primary-electron beam, the secondary electrons can be focused and filtered, e.g., by secondary-electron optics and filter 235, a charged particle unit for deflecting and energy-selecting charged particles, without any effect on the primary-electron beam. Electron detector 240 detects the secondary electrons and produces a secondary-electron signal 245. Though the primary beam and the secondary beam actually occupy the same physical space above the specimen plane, they are drawn as separate arrows in FIG. 2a for convenience of illustration.

The Wien filter uses crossed electric and magnetic fields, the amplitudes of which are adjusted so that there is zero net force on the primary beam and a deflection (transverse) force on the secondary beam.

Figure 2B:
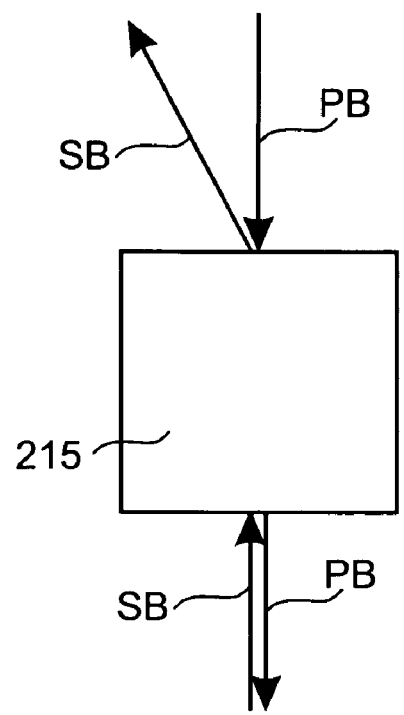
FIGS. 2b and 2c show schematically other beam paths that may be realized with a Wien filter type separating unit.
Figure 2C:
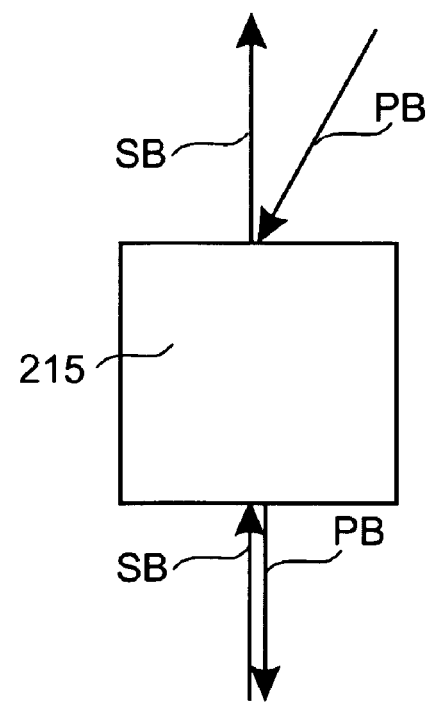

Schematic views of the usage of a Wien filter 215 are further shown in FIGS. 2b and 2c. Thereby, the electric and magnetic fields within the Wien filter are adjusted such that in FIG. 2b the primary charged particle beam is unaffected. Contrary thereto, within FIG. 2c the electric and magnetic fields are adjusted such that the secondary charged particle beam is unaffected. Nevertheless, both embodiments utilize the separation of the primary and secondary beam. Thus, focusing or filtering can be applied to the beam of secondary charged particles without influencing the primary charged particle beam. According to a further option (not shown) it is further possible that both beams are deflected to some degree, whereby a beam separation is achieved.

Figure 3A:
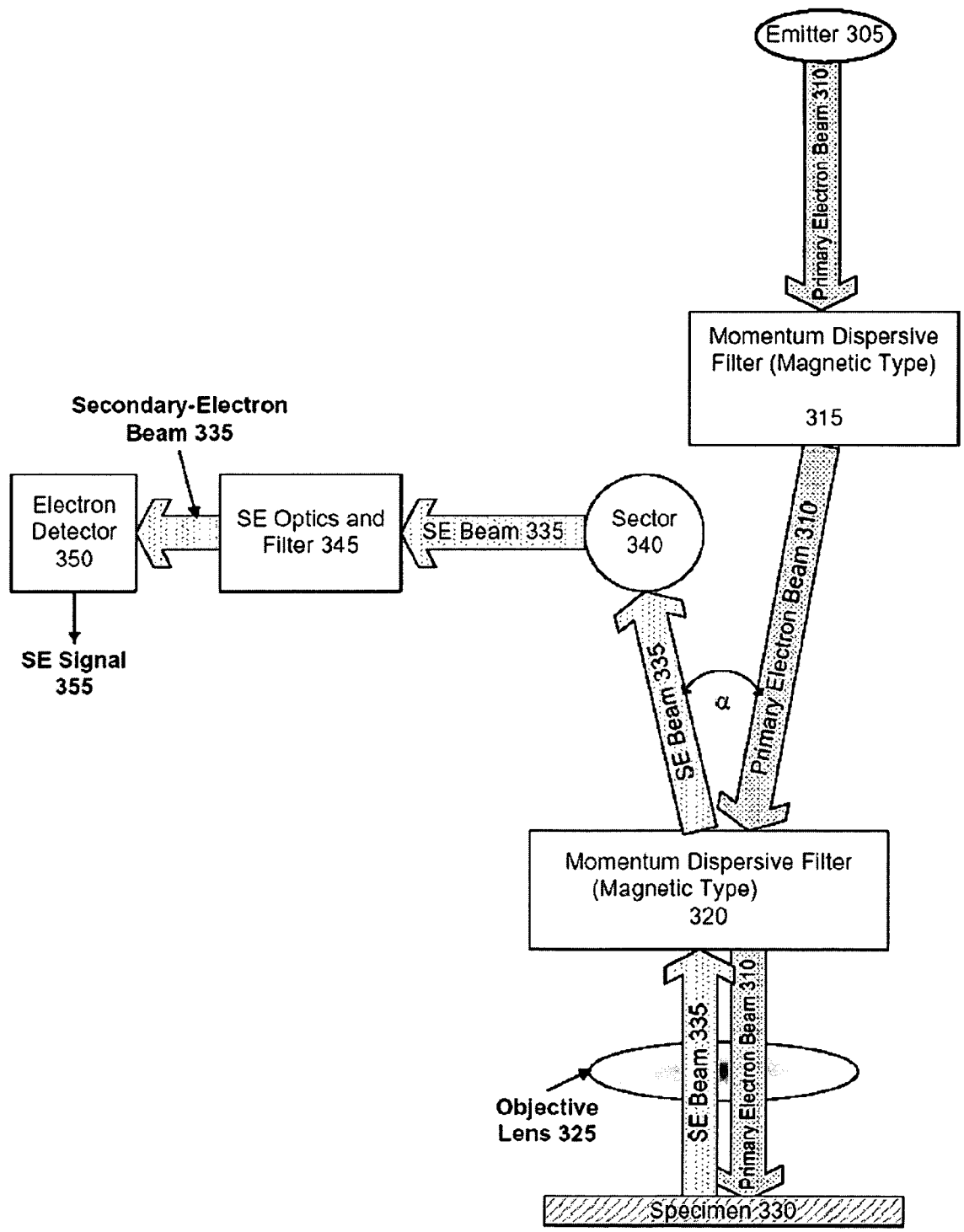
FIGS. 3a to 3d show schematic views of embodiments according to the present invention with magnetic dipole beam separating unit.

Another method of separating the primary and secondary beams is to use magnetic deflection without an electric field. FIG. 3a shows schematically an arrangement of magnetic-beam separator optics in accordance with an embodiment of the invention. Emitter 305 produces a primary-electron beam 310 which is first deflected by the first magnetic deflector 315 such that primary-electron beam 310 enters a second magnetic deflector 320 at an angle. To keep the effect of the magnetic beam separator on the primary beam small, the angle of deflection in the first magnetic deflector 315 should be kept below 10 degrees. Primary-electron beam passes through the second magnetic deflector 320 and is directed at specimen 330. Secondary electrons of beam 335 are then deflected by the second magnetic deflector 320 such that the total angle a of separation of primary beam 320 and secondary beam 335 is roughly twice that of the deflection of the primary beam in the first magnetic deflector 315 (a=15-20 degrees). This separation is enough to allow for a beam bender, sector 340, to be mechanically isolated from primary beam 310 and to be made strong enough to deflect secondary beam 335 so that the secondary electrons are now traveling with a large angle, that is between 30° and 100°, with respect to the primary beam.

Generally, sectors that might be combined with the embodiments disclosed herein might be electrostatic, magnetic or combined electrostatic-magnetic. Since the space required for an electrostatic sector is smaller than the space for a sector including a magnetic part, typically an electrostatic sector is used.

Following sector 340, which already has conducted a reduction of divergence (focusing) at least in one dimension, is a set of secondary-electron optics 345 which additionally focuses and filters the secondary beam. Noteworthy is that this configuration may result in a shifted column; that is, the upper portion of the primary beam optics (e.g., emitter 305 and part 1 magnetic deflector 315) is shifted laterally from the lower portion (e.g., part 2 magnetic deflector 320 and objective lens 325). Thus, emitter 305 does not have line-of-sight view of specimen 330. After passing through secondary-electron optics and filter 345, secondary-electron beam 335 is detected by electron detector 350 to produce a secondary-electron signal 355.

To achieve large angle beam separation a beam bender or sector after the beam separator can be used. The primary beam is completely shielded and therefore unaffected by the sector fields. Sector 340 can be either electrostatic, magnetic or both. An electrostatic beam bender is used where space is a consideration.

Figure 3B:
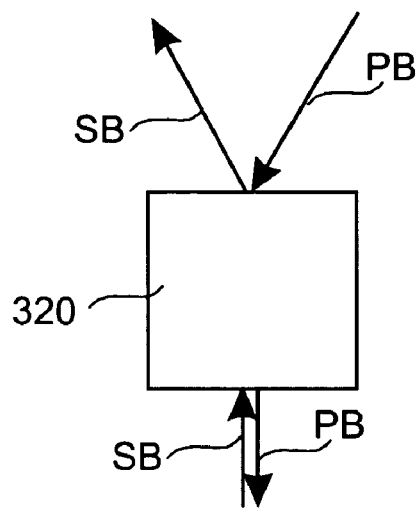
Figure 3C:
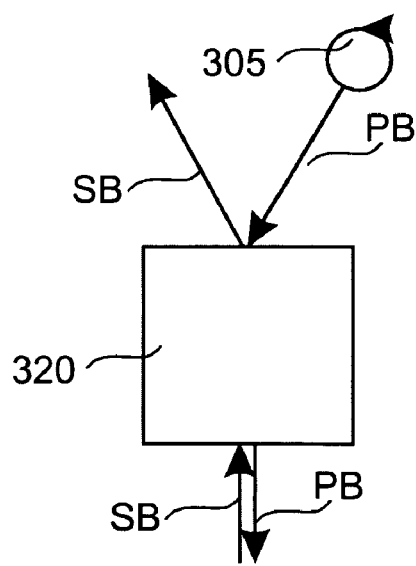

FIG. 3a refers to the specific embodiment realized with a magnetic deflector affecting the primary and the secondary charged particle beam. FIGS. 3b to 3c show schematically applications which can be realized in general. This beam paths may be combined with any other details of other embodiments.

Therein, a magnetic deflector 320 is shown. Within FIG. 3b the primary charged particle beam enters the magnetic deflector under a defined angle of incidence; and is deflected towards a specimen. The beam of secondary electrons, which are released from the specimen, enters the magnetic deflector on its way back towards the optical column and is deflected such that the primary charged particle beam and the secondary charged particle beam are separated. The magnetic deflector 320 acts as a separating unit between the primary and the secondary charged particle beam.

Figure 3D:
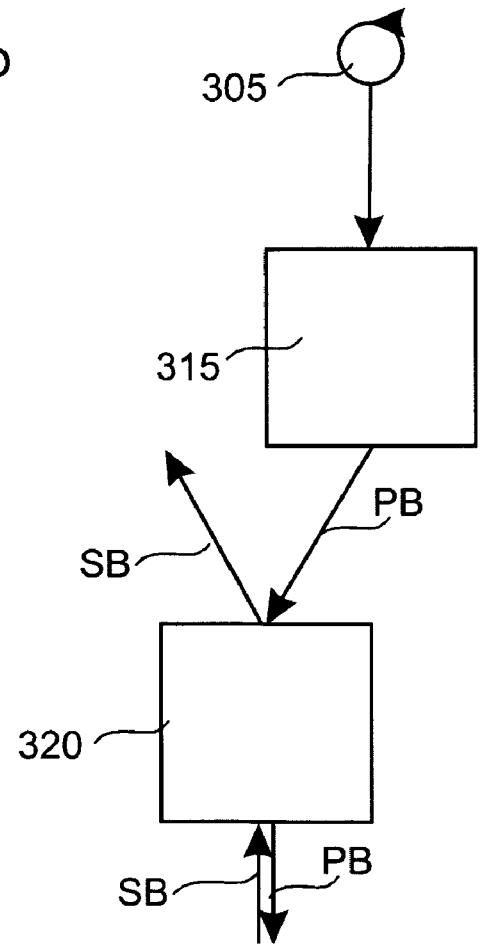

The general usage shown in FIG. 3b can be applied for different embodiments that are shown in FIGS. 3c and 3d. In FIG. 3c, the gun 305 emitting the electrons is tilted with respect to the electron direction on impingement on a specimen. If a parallel primary electron beam direction of emitted electrons and of electrons impinging on a specimen is required, a further magnetic deflector 315 may be used to compensate for the beam-tilt introduced by magnetic deflector 320. Again, these schematic beam paths can be combined with any other embodiments showing further details of the charged particle optics.

Figure 4A:
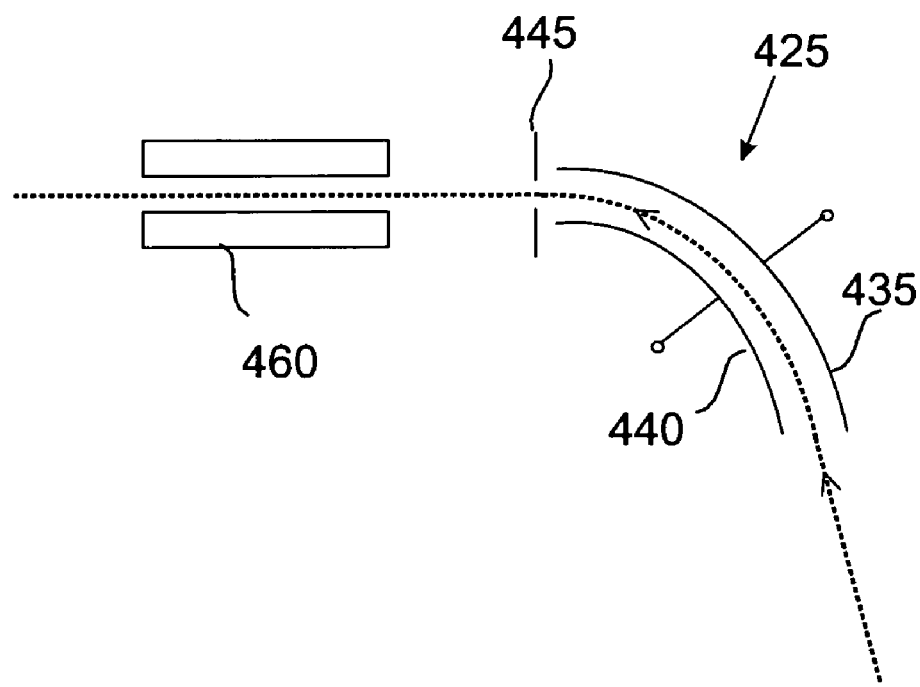
FIGS. 4a and 4b show schematic side views of charged particle units according to the invention.

Further embodiments will be described with respect to FIGS. 4a and 4b. FIG. 4a shows a sector 425. Sector 425 has a negatively-charged V-bend 435 and a positively-charged V-bend 440 serving to bend the electron beam. Optionally, a pair of sector side plates can be provided. Thereby, the electron beam is focused in one dimension and, additionally, is kept at a high energy to avoid time of flight effects which may have impact on high-speed detection. A focusing in the second dimension takes place in quadrupole element 445. Thereby, the sector 425 and the quadrupole form a double-focusing sector unit. Further, it may be possible to use a cylinder lens instead of a quadrupole to obtain double focusing.

The electron beam enters filter 460 provided in form of a cylinder. Within the cylinder a potential-saddle is applied due to biasing of the cylinder. Electrons having a sufficiently large energy can pass the potential-saddle (potential hill). Other electrons are backwardly redirected. Yet, all electrons are influenced by the same potential-saddle. In order to have all electrons being influenced by the same saddle potential, the opening of the cylinder requires a defined sufficiently large size. Thereby, the transparency of the filter is increased. There are no losses due to impingement of electrons on a grid and hardly any losses due to an insufficiently focused beam.

Figure 4B:
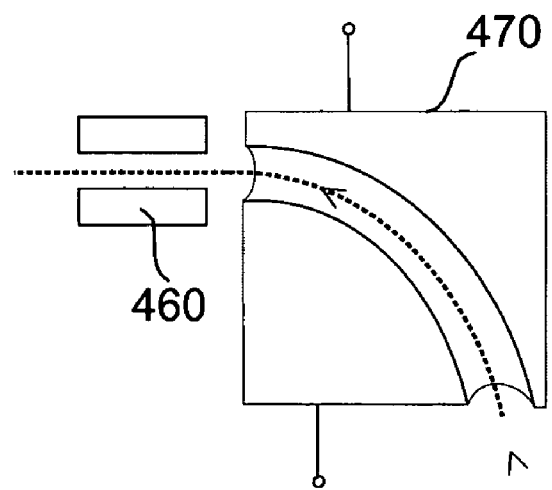

In the further embodiment of FIG. 4b a hemispherical sector 470 is used. In view of the hemispheric shape the electron beam entering the sector is focused in both dimensions. Thus, no additional focusing unit is required for the double-focusing sector unit 470. Electrons can be energy-selected in filter 460 with high transparency.

According to a further embodiment (not shown) the focusing of the double focusing sector unit (425, 445 in FIG. 4a or 470 in FIG. 4b) can be assisted with an additional focusing unit. Thus, the double focusing sector unit may also include additional lenses, for example an Einzel-lens. This additional lens may also be applied to move the focus of the sector to a position corresponding to the position of the filter.

Figure 4C:
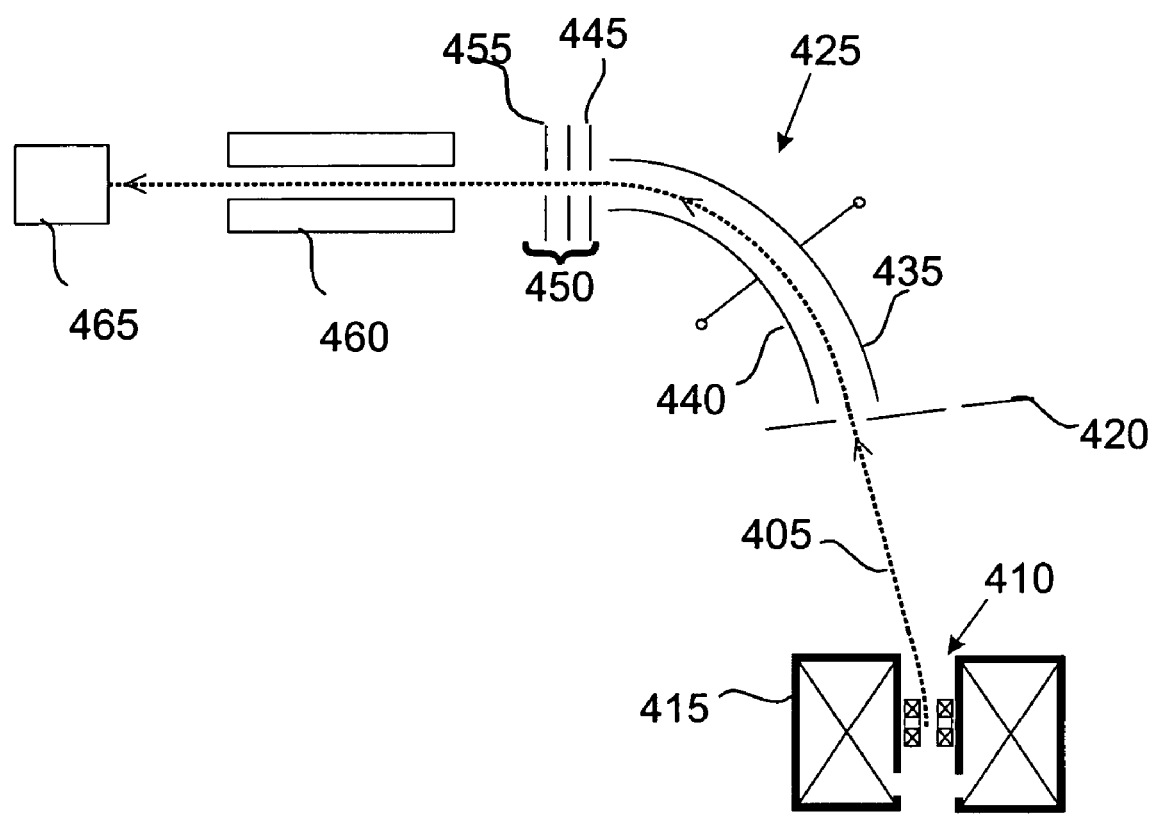
FIG. 4c shows a schematic side view of a further embodiment according to the invention.

A further aspect will now be described with respect to FIG. 4c, wherein the detection optics according to one embodiment is shown. FIG. 4c includes a sector 425 acting as a deflection angle increasing unit. The beam of secondary electrons, which has already been separated from the optical axis by an angle of for example 3° to 15°, is further deflected towards detector 465.

Generally, an electrostatic beam bender can be either cylindrical or hemispherical. The cylindrical type suffers from the fact that as the beam is bent the secondary electrons are focused in one plane and not in the other. A hemispherical beam bender focuses the secondary beam in both planes. The cylindrical sector can be used with side plates biased to achieve focusing in the transverse plane, yielding similar focusing properties than the hemispherical sector.

FIG. 4c is a schematic view of such a cylindrical sector. Side plates (not shown) can be positioned—with respect to the perspective of this figure—in front of and behind the gap between the sector electrodes 435 and 440.

A secondary electron beam 405 passes through an opening 410 in an objective lens 415 and an opening in a plate 420 to enter a sector 425. Sector 425 has a negatively-charged V-bend 435 and a positively-charged V-bend 440 serving to bend the secondary-electron beam 405. Further, a pair of sector side plates are provided. Secondary electron beam 405 is then aligned as it passes through an SE alignment quadrupole element 445 and focused as it passes through an SE focusing lens 450. Secondary electron beam 405 then passes through openings in grounded plate 455 and in SE filter 460 to an electron detector 465.

A drawback of the cylindrical sector without side plates is that it focuses the SE beam in one plane (up and down on the page) and not the other (in and out of the page). This lack of focusing can be compensated for by placing electrodes on the sides of the cylindrical sector to force focusing action in this plane. There are two motivations for uniform focusing action by the sector. One is to provide for a small spot on the high-speed detector and the other is to enable good energy filtering because the filter is sensitive to both energy and direction of the secondary beam.

Thus, the filter should be located approximately a focus of the secondary electrons.

Generally, the filter (energy-selection filter) provided for the embodiments disclosed in the present application is typically formed as follows. It is desirable for high current density apparatus to provide a high transparency and, thus, high collection efficiency for the secondary particles. Thus, electron losses have to be reduced. Providing a filter with a single opening increases the possibility to have almost all electrons of an electron beam to pass through the filter. Otherwise, losses may occur between hardware components bridging different openings.

The cylinder like (or aperture-like) filters shown in the figures form a potential saddle that varies depending on the beam path in the filter. Thereby, for a cylinder with a round footprint the dependency is only radial, that is the distance from the axis. For cylinders having quadratic footprints, pentagon footprint or other shapes as a footprint, which may be used for other reasons, the potential shape varies with the distance from the axis as well as an azimuth coordinate.

Nevertheless, the above described systems have a potential-form of a saddle and reflect a portion of the beam with a particle energy below a certain threshold.

The longer the cylinder the closer is the threshold potential to the potential applied to the filter. For short filters, the potential-saddle may vary significantly from the applied bias. However, space requirements may justify this. Additionally, the mean particle velocity in the filter decreases for long filters. Thus, in view of a high-speed requirement the length may also be limited.

As an example, the length of the filter may be within the range of 200 µm to 20 mm. The aperture for having the beam pass therethrough may be within the range of 200 µm to 10 mm.

Figure 5:
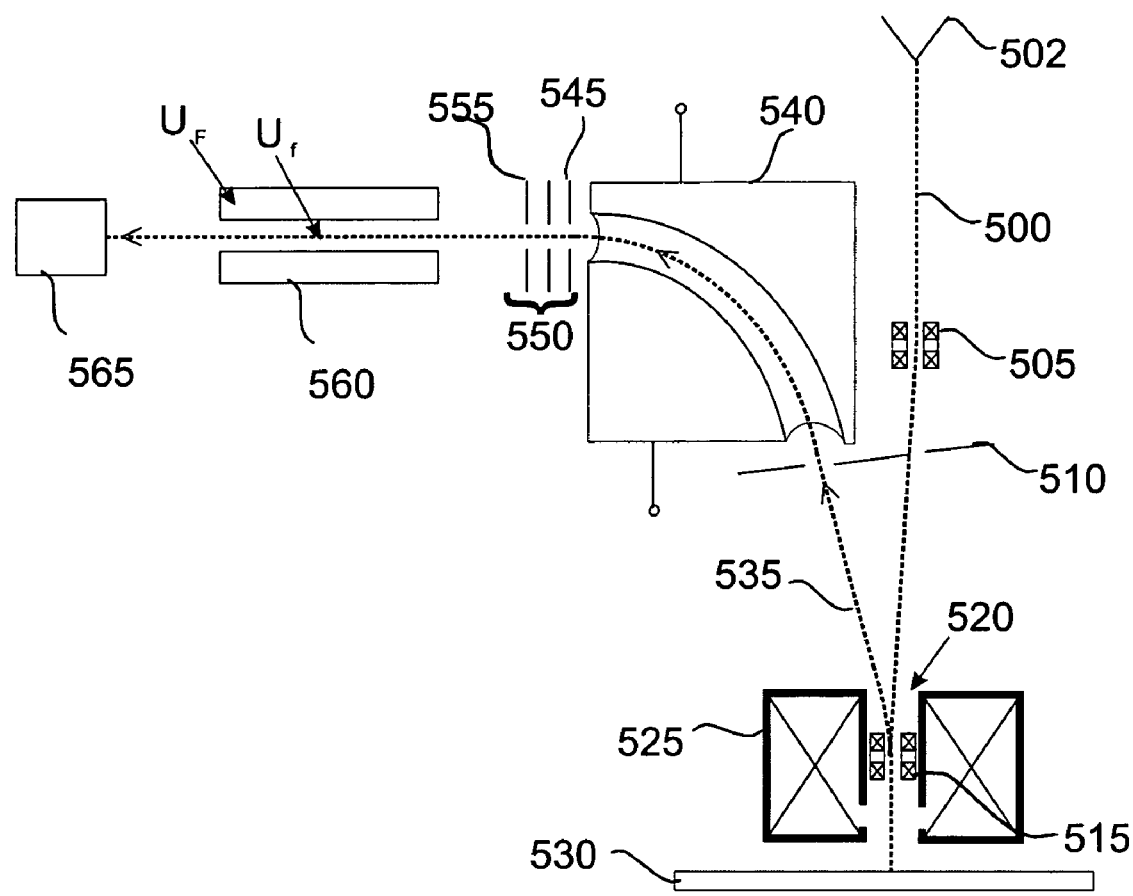
FIG. 5 shows a schematic side view of a further embodiment including a hemispherical sector.

FIG. 5 shows a cut-away, perspective view of an optical system having a magnetic type of beam separator with a hemispherical sector in accordance with an embodiment of the invention. Side plates are not required in this embodiment since the hemispherical sector provides focusing of the secondary electron beam in both planes.

Referring to FIG. 5, a primary-electron beam 500 from an emitter 502 is bent (changes direction) as it passes through a first magnetic beam separator deflection coil 505. Primary-electron beam 500 passes through an opening in a plate 510 and is bent (changes direction) again as it passes through a second magnetic beam separator deflection coil. Primary-electron beam 500 continues through an opening 520 in objective lens 525 to strike a sample such as semiconductor wafer 530. The resulting secondary-electron beam 535 passes through opening 520 in objective lens 525 and is bent (changes direction) as it passes through second magnetic-beam separator deflection coil 515. After passing through an opening in plate 510, secondary-electron beam 535 enters a hemispherical sector 540.

Following the sector is a set of focusing and filtering elements to focus the secondary electron beam to a small (e.g., 4 mm diameter) spot on the active area of electron detector 565 and to enable energy filtering of the secondary electron beam. Focusing can be done either with magnetic lenses or electrostatic lenses. Electrostatic lenses offer a more compact size and reduced complexity. Filtering requires one or more electrostatic electrodes since one must change the energy of the secondary beam.

In the embodiment of FIG. 5, the focus lens is a simple electrostatic lens with two plates (SE align quadrupole 545 and plate 555) surrounding a focusing electrode, thereby forming a lens 550. Secondary-electron filter 560 is a long cylinder which is biased approximately to the same potential as the sample wafer.

Lens 550 can be an immersion lens or an Einzel lens. In the event the wafer is biased the plates 545, 555 may be grounded.

Within the above-described embodiment, the quadrupole 545 and the plate 555 are integrated in the lens 550. Generally, with regard to all embodiments shown in this application, it is possible that the quadrupole and/or the plate are provided independently of the lens. Thereby, an appropriate number of lens electrodes is provided and additionally the electrodes of the quadrupole 545 and the plate 555 are provided. Further, it is possible that instead of the plate 555 a quadrupole is provided. This second quadrupole would allow for additional alignment of the secondary electron beam.

Generally, a lens focusing the secondary electron beam is positioned between the separating unit (Wien filter and/or magnetic deflector) and the detector. Typically, it is positioned between the deflection angle increasing unit (separating unit) and the filter. The focusing lens can either be electrostatic (see above-mentioned Einzel-lens), magnetic or combined electrostatic-magnetic. Typically, for space reasons an electrostatic lens will be used for focusing the secondary electrons. Further, it is possible to provide an Einzel lens or an immersion lens as focusing unit for the secondary electron beam.

Focusing the secondary-electron beam 535 to a small spot on the detector enables high-speed imaging. The detector type is, for example, a p-i-n diode. Such detectors are excellent for high-current electron-beam systems since they have very high quantum efficiency (nearly equal to one) and excellent response time if they are small. Response time is proportional to capacitance of the device and capacitance is proportional to area. Thus, the area should be minimized. Therefore, however, a focusing of the secondary electron beam is advantageous. Typcially, a detector active area of 4-5 mm diameter is suitable for imaging rates in the vicinity of 600 MPPS.

Even though this embodiment has been described including a pin-diode, other detectors may be used. For all embodiments disclosed herein, a fast scintillation detector may be used or a pin-diode may be used. The detector is typically arranged behind the deflection angle increasing unit, that is for example the sector in the above-described figure. In case of a scintillation detector the secondary electron beam will typically not be focused on the detector. Thereby, it's life time is increased and contamination is reduced.

For normal imaging modes (non voltage contrast) the goal of the focusing elements is to produce a small spot on the detector. In this mode both the filter and focus electrodes can be employed for SE beam focusing.

In voltage contrast mode the filter electrode 560 acts as a high-pass filter, rejecting secondary electrons that are below a set (user selectable) initial energy level at the plane of wafer 530. The secondary electrons exit the sector 540 and are focused through a decelerating electrostatic lens (SE focus lens) such that a crossover is formed inside the filter electrode field. The filter electrode 560 is biased to a potential $U_F$ producing a saddle potential Ur. These potentials are generally relative potentials with respect to the wafer. Therefore, electrons released from the specimen with a potential above Ur can pass the filter, whereas electrons with a potential below (or equal) Ur can not pass the filter and are rejected.

A typical application for voltage contrast imaging is unfilled or filled contact holes in devices on a wafer. This layer of the device to be inspected consists of a field of dielectric material with isolated conductive contacts that have a path to either the bulk silicon or a large capacitance metal layer below the contact. One voltage contrast technique that has shown to be successful in electron-beam inspection is to charge the dielectric material positively with the electron beam to a value in the range of 5-50V. Secondary electrons that emit from the charged dielectric must therefore have an initial energy greater than the surface charge potential to escape and contribute to the detector signal. Secondary electrons that are emitted from the good contacts are essentially emitted from a grounded substrate and have the typical secondary energy distribution associated with grounded metal materials with a peak near 2 eV. If one were then to filter the secondary signal such that all electrons having an initial energy greater than (for example) 5 eV are detected, the regions in the image representative of the charged dielectric would appear dark and the good contacts would appear bright.

Figure 6:
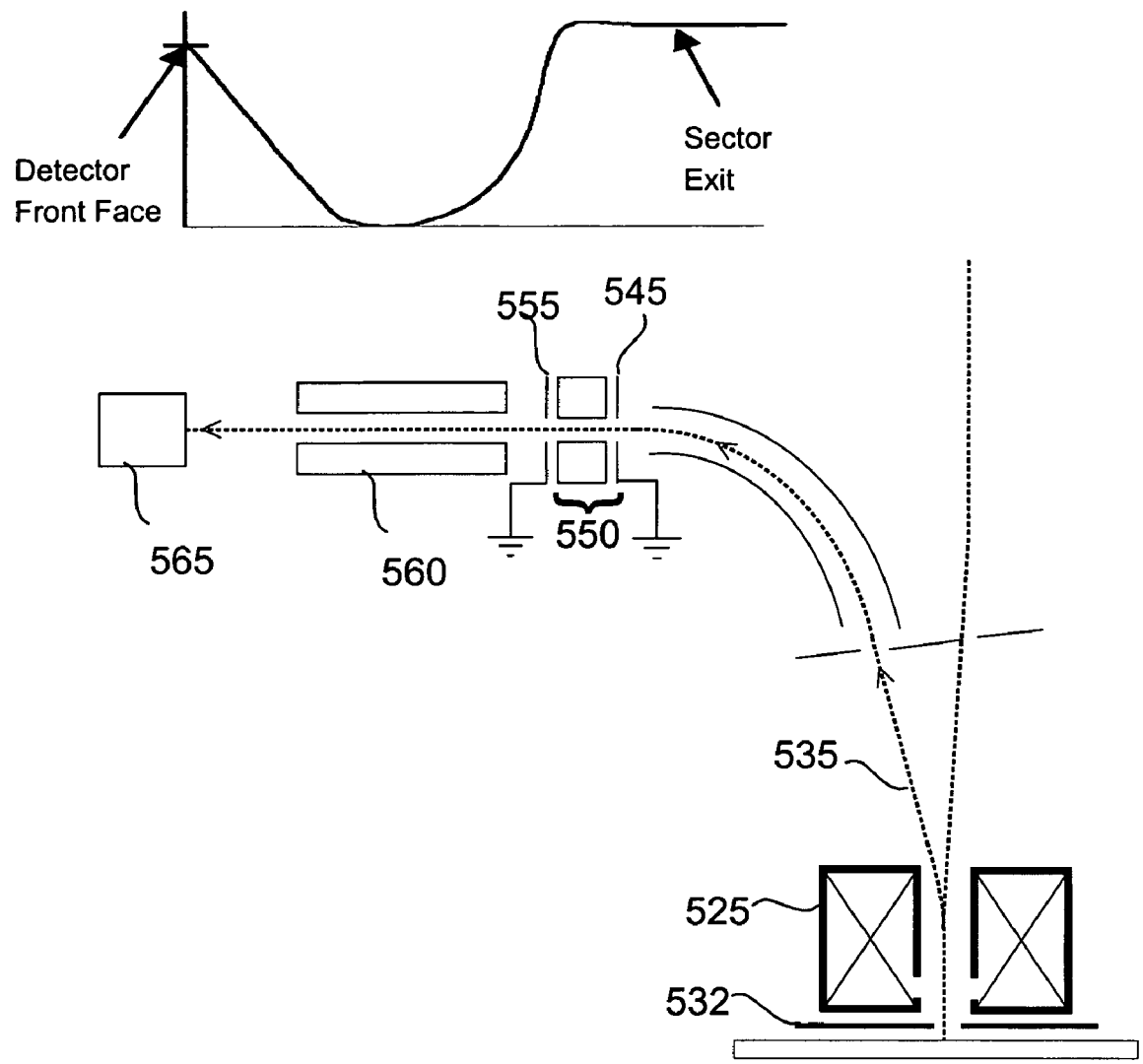
FIG. 6 shows a schematic side view in combination with a potential of a saddle potential filter.

FIG. 6 is a schematic view of the secondary-electron optics and filter electrode configuration which illustrates the energy filter functionality of the arrangement of FIG. 5.

The extraction of secondary electrons released by the specimen IS controlled by proximity electrode 532. Afterwards an accelerating unit like a biased part of the objective lens, e.g. a biased pole piece, or a biased part of the column housing or a further acceleration electrode (not shown) accelerates the electrons for improved high speed detection. This acceleration can be included in all embodiments shown in the present application and has the advantage that the collection efficiency can be increased if secondary particles are accelerated in a predefined acceleration field. The field of the proximity electrode can be adjusted according to the specific application for control of the imaging conditions. Afterwards, typically, the charged particles are accelerated on for example 5-12 keV or the like by the acceleration unit.

The above-mentioned acceleration unit is biased relative to the wafer potential. That is, it can either be biased to a potential while the wafer is on ground potential, it can be grounded while the wafer is biased to a different potential, or both parts can be biased to obtain a desired potential difference.

Secondary electrons exit the sector 540. They are then focused by an Einzel lens 550 (ground plates 545 and 555 and a focusing electrode), which by definition has no net effect on the electron energy; the SE bundle exits the Einzel lens with the same energy with which it entered. The bundle then passes through a filter electrode 560 which is biased to approximately the same potential as the wafer. The filter electrode bias is chosen to establish a saddle field in the center of the electrode as illustrated; that is, the secondary-electron kinetic energy after exiting sector 540 remains substantially constant through the Einzel lens, declines to a minimum at the center of the energy filter 560, and rises again toward the front face of detector 565. The saddle field strength determines the filter strength. If the saddle potential were to be more negative than the wafer, then the electrons would be turned around in an electrostatic mirror condition. The voltage contrast application requires setting this saddle field strength to a level that rejects secondary electrons from positively charged regions of the wafer surface.

Additionally, for non-voltage-contrast applications the filter electrode can be used as an additional focusing electrode to control the spot size on the detector. As explained above, for pin-diodes a smaller spot would be typical in order to increase the detection speed, whereas a larger spot would be typical for scintillation detectors in order to increase life time and to reduce contamination.

For all embodiments shown herein, it is generally possible to position the filter between the separation unit and the detector. Thereby, if an additional deflection angle (separation angle) increasing unit is present, the filter may typically be positioned between the deflection angle increasing unit and the detector.

In order to provide an improved filtering, the filter should be positioned between one secondary electron focusing unit and the detector.

Figure 7:
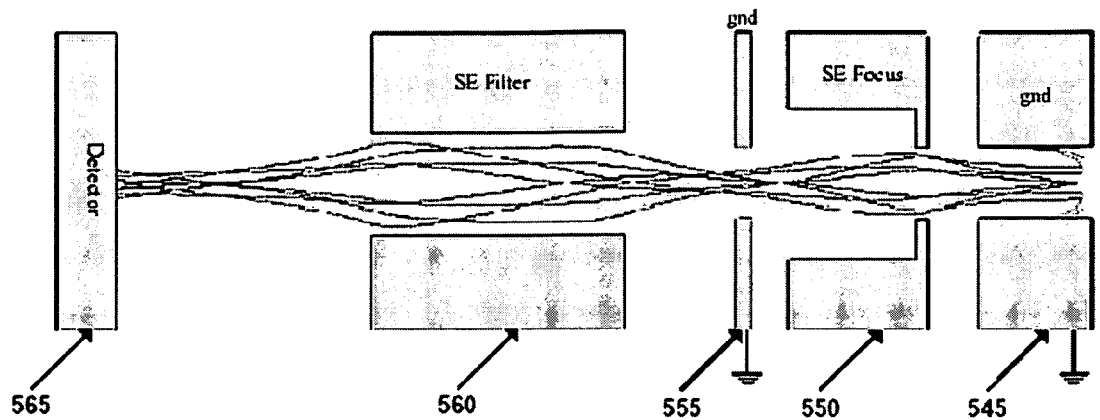
FIGS. 7 and 8 show exemplary beam paths of the secondary beam optics of embodiments according to the invention.
Figure 8:
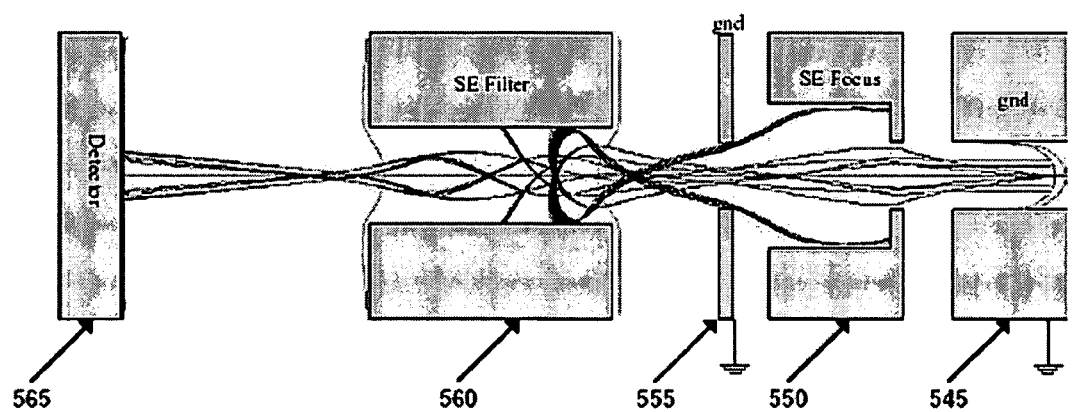

The voltage contrast effect is shown in FIG. 7 and FIG. 8 using ray-trace outputs of MEBS electron-optical modeling software.

FIG. 7 illustrates ray traces through the secondary-electron optical elements of FIGS. 5 and 6 for the non-voltage-contrast case. In this example, all the electrons launched into the SE optics module reach the detector 565 within a spot of below 7 mm diameter.

FIG. 8 illustrates ray traces through the secondary-electron optical elements of FIGS. 5 and 6 for the voltage contrast case. The filter electrode 560 in this case is biased to provide a saddle potential of 6 V below the wafer potential. Secondary electrons with initial energy about approximately 6 eV are rejected by the filter and never reach the detector. Secondary electrons with initial energies above −6 eV reach the detector. The saddle potential of 6 V corresponds to a bias of the filter electrode tube of about 20 V below the wafer potential.

Figure 9:
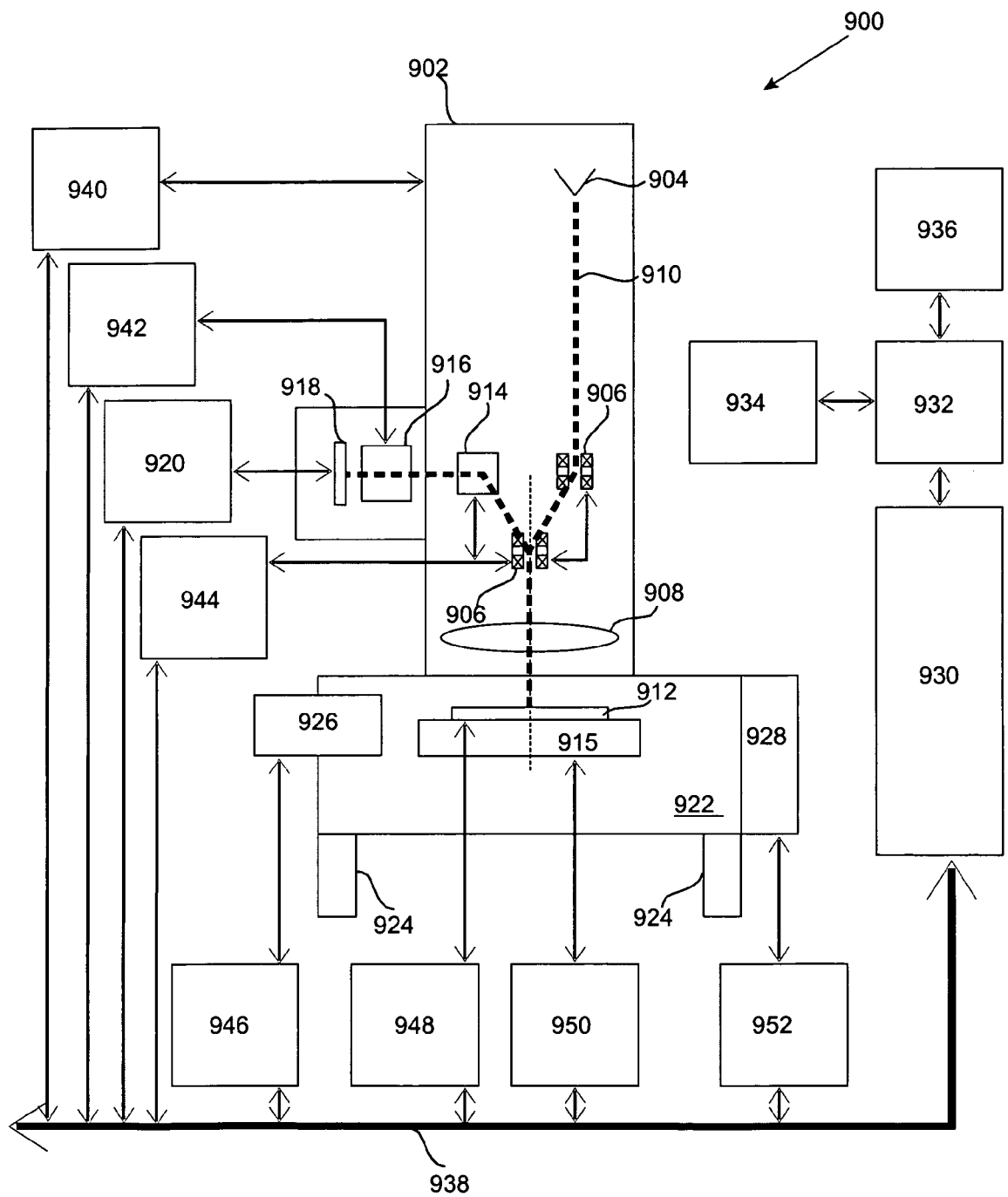
FIG. 9 shows a schematic side view of a charged particle beam device according to the invention.

FIG. 9 is a schematic illustration of a wafer inspection system 900 in accordance with an embodiment of the invention, employing an electron-optical subsystem as described above with reference to FIGS. 5-8. An electron beam column 902 includes an e-beam source 904, magnetic beam separator 906 and objective lens 908 for applying a primary beam 910 to a wafer 912 carried on an x-y stage 915. Secondary electrons from wafer 912 30 pass through beam separator 906, sector 914, and focusing and filtering elements 916 to detector 918. The signal from detector 918 is supplied to imaging electronics 920.

Wafer 912 and stage 915 are contained in a vacuum chamber 922 supported on an isolation frame 924. Vacuum pumps 926 maintain a suitable vacuum in the chamber 922 and column 902 during operation. Wafer 912 is placed in and removed from chamber 922 by a wafer handler subsystem 928.

Wafer inspection system 900 is controlled by a computer system 930 having a control processor, image processor and image memory, for example. Computer system 930 is in communication with a workstation 932 having input/output devices 934 such as a keyboard and a pointing device or other suitable devices permitting human interaction, and a display 936. Control processor 930 communicates via a bus 938 with control circuits such as PE-beam control 940 which regulates the primary-electron beam 910, SE optics control 942 which controls the focusing and filtering elements of column 902 to provide a suitable secondary-electron beam on detector 918, PE alignment and deflection control 944 which controls the application of primary beam 910 on wafer 912, vacuum pumps control 946 for controlling vacuum pumps 926, wafer voltage control 948, stage control 950, and handler control 952. Control processor 930 also receives imaging data via bus 938 from imaging electronics 920 for storage, processing and image analysis.

Figure 10:
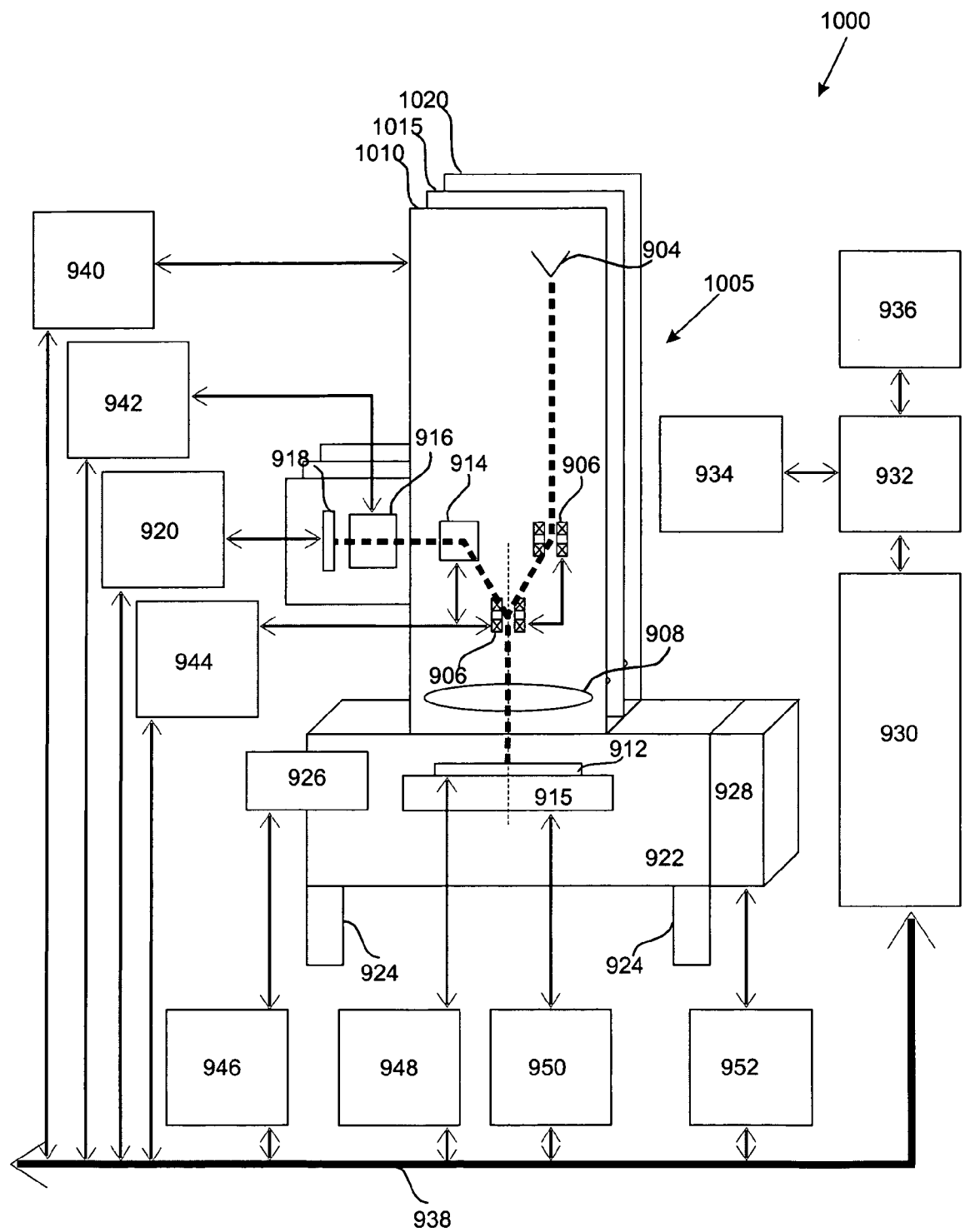
FIG. 10 shows a schematic side view of a charged particle multi-beam device according to the invention.

To provide for greater throughput than is possible with single-column system, multi-column systems are also contemplated. FIG. 10 shows schematically a multi-column e-beam wafer-inspection system 1000 having a row 1005 of e-beam columns 1010, 1015, 1020 to enable simultaneous inspection of multiple regions of a wafer 912.

Within FIG. 10, a multi-column device including three subunits is shown. As will be understood by a person skilled in the art any suitable other number can be applied. For example 5, 10 or 15 electron beams can be arranged in a row.

Further, it is possible to position several rows next to each other. Thereby, an array of electron beams impinging on a specimen is realized. In order to have sufficient space for the separated charged particle beams, for example two rows can typically be arranged next to each other. Nevertheless, if no space-restrictions are present, 3, 5 or any other suitable number rows may be applied as well.

For arranging several sub-columns in a line, in an array or other pattern, some of the components, that usually are individually acting on a single electron beam in the case of a single-beam column, may be combined. Thus, one emitter array emits all electron beams or one objective lens focuses all beams of the multi-beam device. Examples are given in the following.

Regarding the objective lens, it may be appropriate to provide a multi-beam lens system as for example disclosed in European Application Nr. 02 02 8345 assigned to the same assignee as the present application. Thereby, a compound electrostatic-magnetic lens sharing one excitation coil is used. An example is shown in FIG. 11.

The following components can be seen in FIG. 11. Optical system 10 comprises a magnetic lens component. This magnetic lens component comprises an excitation coil 15. The diameter of this coil is about 100 mm to 1000 mm. Preferably, it is between 100 and 400 mm. Thereby, the coil diameter depends in general on the number of electron beams 12 focused by the optical system.

Further, there is an upper pole piece 16 and a lower pole piece 17. These pole pieces are preferably made of a magnetic conductive material, like permalloy or µ-metal. In addition to the magnetic lens component there is an electrostatic lens component. The lens system can be described as a plurality of sub-lenses for each of electron beams 12. In the embodiment of FIG. 11, each of the electrostatic immersion sub-lenses of the electrostatic lens component comprises an upper electrode 18 and a lower electrode 19. These electrodes should be made of a non-magnetic conductive material. Openings 14 provided in the electrostatic components and magnetic components overlap in a manner that in general each electron beam 12 can travel through the optical system using a different opening.

In order to control the focusing of the optical system 10, controller 7 for the upper electrode 18, controller 8 for a lower electrode 8 and controller 9 for the excitation coil are provided.

The function of optical system 10 of FIG. 11 will be explained in the following. Several electron beams 12 with an optical axis 11 are for example focused on specimen 13. The magnetic focusing field is induced to the pole pieces by excitation coil 15. Controller 9 drives excitation coil 15. Close to the excitation coil, cooling units (not shown) can be located. The pole pieces guide the magnetic focusing field to openings 14 for the electron beams. These openings are provided in upper pole pieces 16 and lower pole pieces 17. Due to the focusing fields within the openings 14, the electron beam is focused. To further focus an electron beam 12 by an electrostatic lens, a first electrode 18 and a second electrode 19 are provided. Different potentials are applied to electrodes 18 and 19 by controllers 7 and 8, respectively.

According to an alternative, controllers 7 and 8 can either be connected to a common upper or lower electrode for the sub-lenses or they are able to control at least a plurality of electrodes or a set of electrodes independently.

Figure 1:
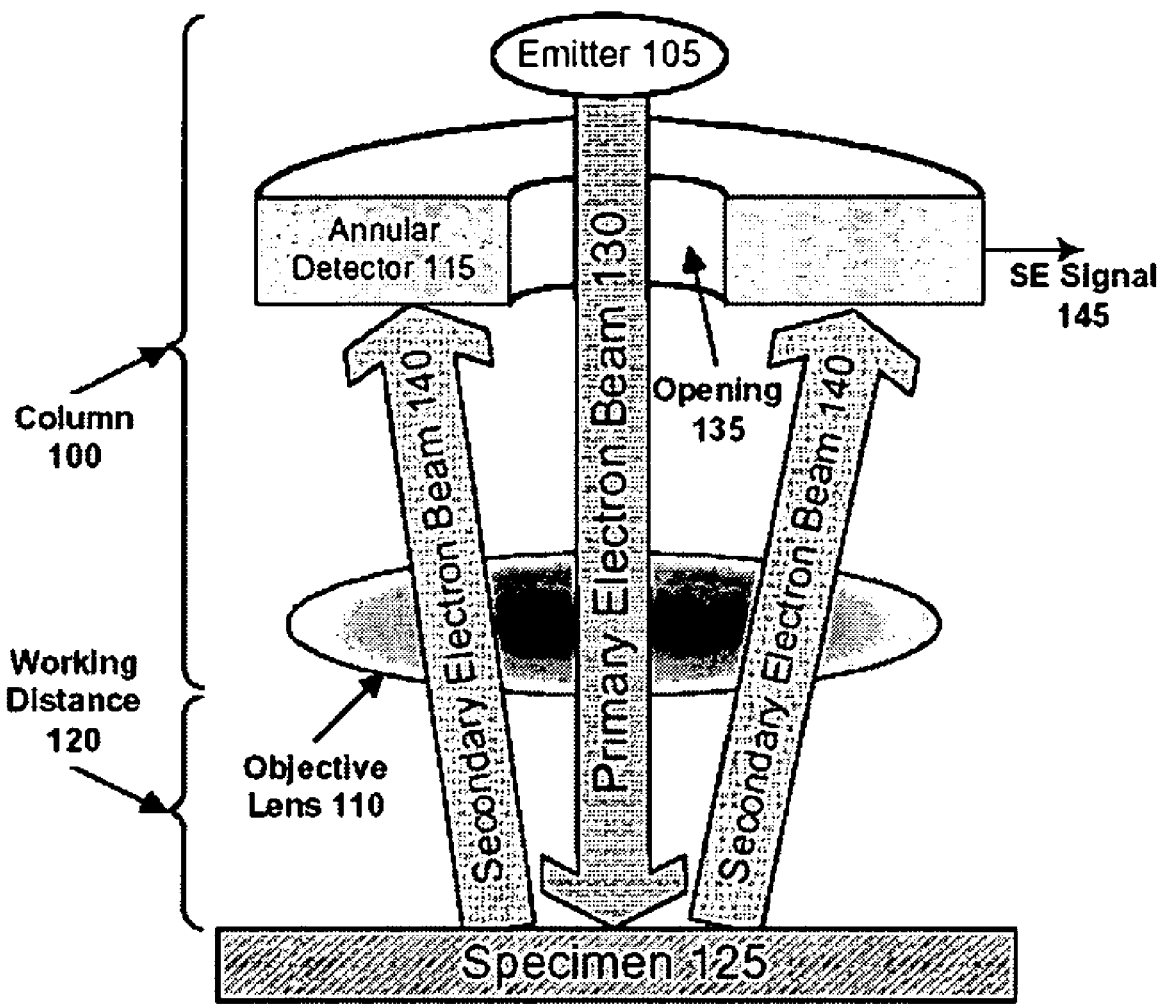
FIG. 1 shows schematically a detection scheme according to the state of the art.

As can be seen from FIG. 1, optical system 10 focuses electron beams 12 on specimen 13. If the optical system 10 is used as an objective lens, it is preferred to have potentials on electrodes 18 and 19, respectively, such that the charged particles are decelerated before impinging on the specimen. Thus, for electrons and other negative charged particles, the upper electrode 18 should be on a more positive potential than the lower electrode 19.

The openings shown in FIG. 11 can be arranged in different patterns. Examples are given in FIGS. 12a to 12c. The region 16a of the upper pole piece is exemplarily drawn as circular. The lower pole piece is in this view located below the upper pole piece. The pole pieces are surrounded by the excitation coil 1 Sa. The excitation coil generates the magnetic field. The pole pieces guide the magnetic field to openings 14. Further, electrodes 18a are shown. The openings through the optical system provided in the electrodes overlap with the openings in the pole pieces.

An electron beam passing through one of openings 14 is focused by the electrostatic and magnetic lens fields provided. Thereby, the magnetic and electrostatic components of the lens are preferably arranged to enable symmetric focusing fields.

Within FIG. 12a, the openings 14 are provided within one row. Thus, at least in two directions of each opening 14 (upper and lower side in FIG. 12a) there are no further neighboring openings. Therefore, the magnetic field is directly guided to the openings. There is no interference of other components or openings with respect to these two sides.

FIG. 12b shows a further embodiment. Therein, two rows of openings are provided. In general, several rows of openings form an m×n matrix. The upper row might be influenced by the existence of the lower row and vice versa. Thus, it might be preferred to add additional openings 32. These additional openings 32 are not used for trespassing and focusing electron beams. However, the uniformity of the magnetic fields guided to openings 14 can be increased, since each opening 14 has a similar adjacent influencing area. The additional openings 32 ("dummy" openings) can be used for all embodiments shown in FIGS. 12a to 12c. Other geometries and sizes of the dummy openings are well within the scope of protection.

FIG. 12c shows a further embodiment of the optical system. Openings 14 in FIG. 12c are provided in four-fold geometry forming a diamond-like pattern. Higher order symmetries can also be realized.

Figure 13:
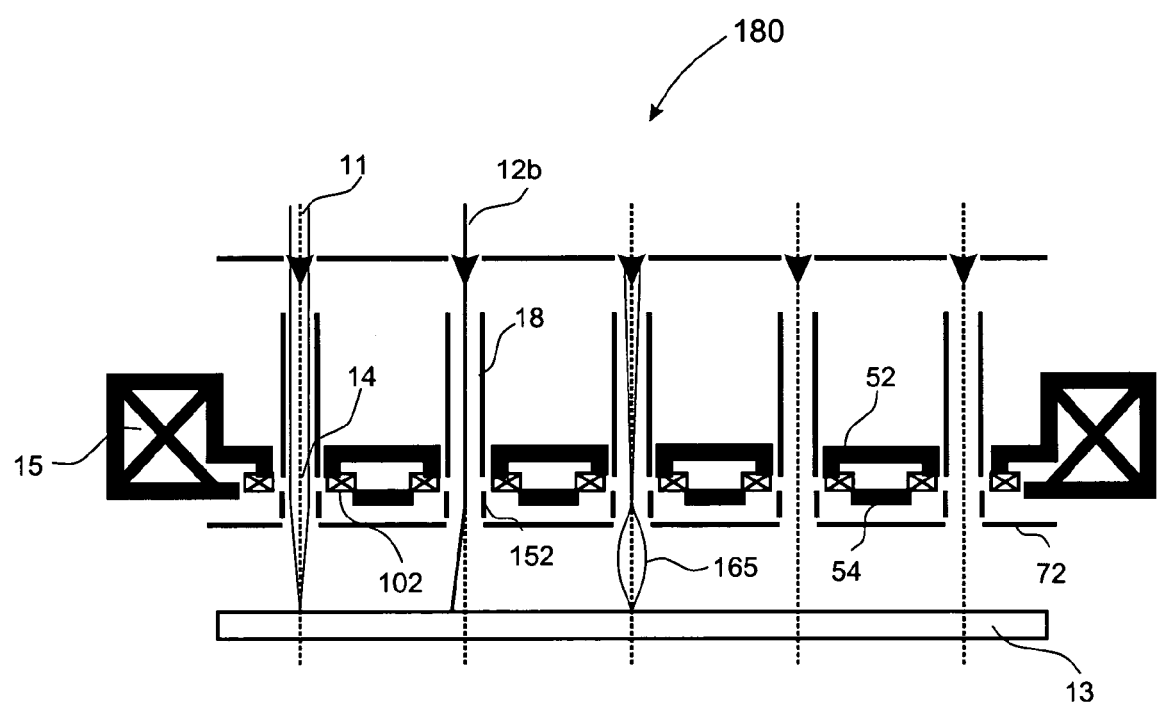
FIG. 13 shows a schematic side view of an objective lens that can be utilized in a multi-beam device according to the invention.

Another example of an arrangement for focusing more than one primary electron beam will be shown in FIG. 13. The optical system 180 comprises an excitation coil 15 and upper and lower pole pieces 52 and 54, respectively. Further, there are means provided for individually adjusting the imaging properties for each electron beam 12. These means are small magnetic coils 102. The electrostatic lens component comprises upper electrode 18 and lower electrode 72. Further, deflection units are provided due to in-lens deflectors 152. Thus, electron beam 12b can be scanned over specimen 13. Secondary particles penetrate the optical system through the same openings 14 used for the primary electron beam.

The embodiment of the optical system 180 makes use of a combined axial- and radial-gap magnetic lens component. The electrostatic lens component is given by upper electrode 18 and lower planar electrode 72. A fine adjustment of lens component variations can be achieved due to small magnetic coils 102. Electron beams 12b following the optical axis 11 above the optical system are deflected by groups of in-lens deflection electrodes 152.

Figure 14:
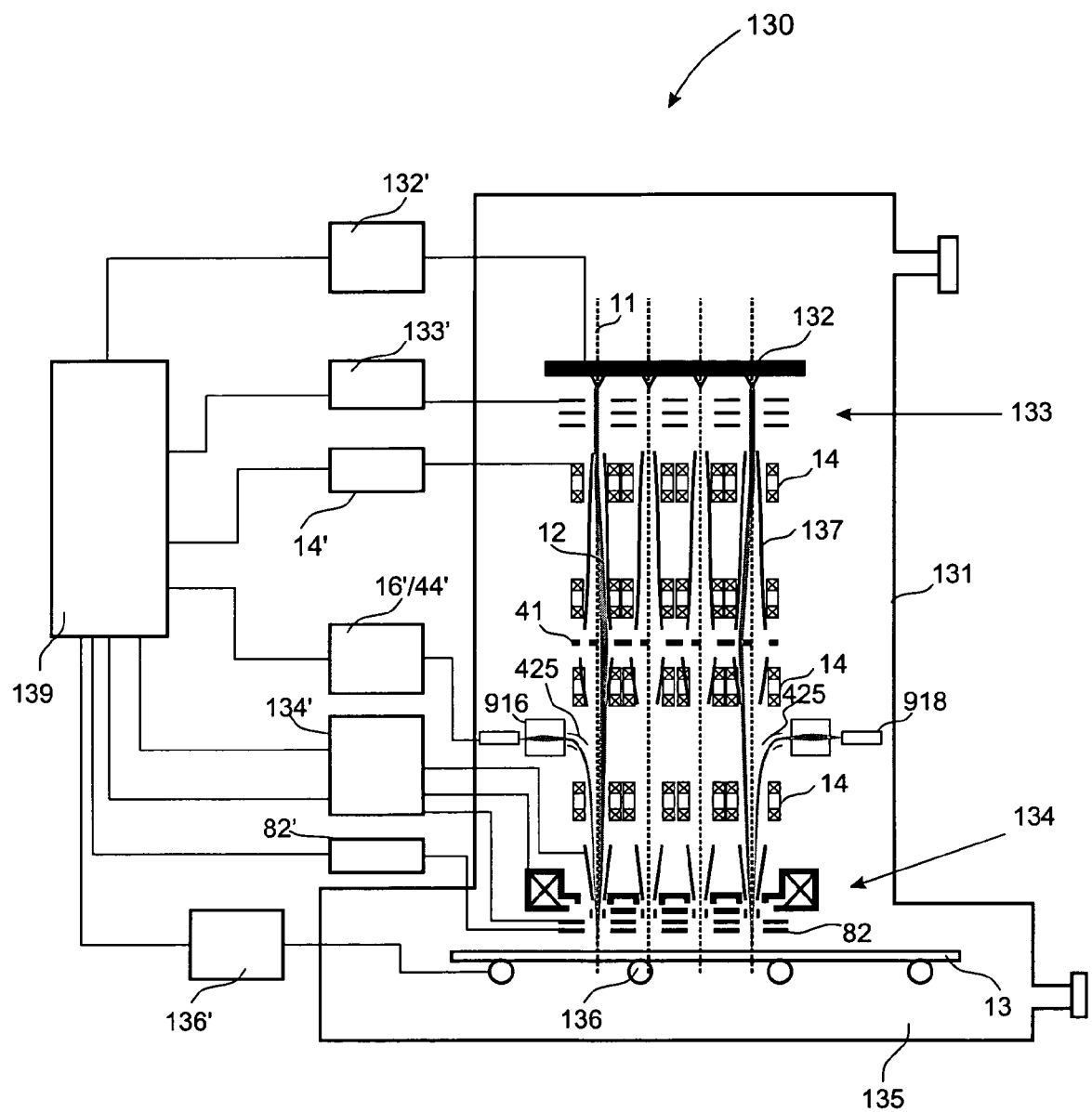
FIG. 14 shows a schematic side view of a charged particle multi-beam device according to the invention.

A further embodiment with an array of multiple beams is shown in FIG. 14. Therein, additionally multi-apertures are provided for each beam. Thus, different apertures can be selected using deflectors. Additional details relating to the selection of aperture openings of multi-apertures, as disclosed in European Application Nr. 03 00 6716 assigned to the same assignee as the present application, may also be utilized.

Device 130 has a housing 131 and a specimen chamber 135. The housing as well as the specimen chamber can be evacuated through vacuum ports. Within the specimen chamber, specimen 13 is located on specimen stage 136, which can move the specimen independently in two directions. For control of the specimen, movement control unit 136' is connected to specimen stage 136. Each of the four electron beams 12 has its own optical axis 11. The beams are emitted by an emitter array 132. The emitter array is controlled by control unit 132', that is, the beam current, the anode potential and a possible synchronization of the electron beams with the scanning over specimen 13 for each electron beam, respectively, is controlled. A multi-lens system 133 comprising an Einzel-lens module for each electron beam is used as a condenser lens for the four charged particle beams. The lens system 133 is controlled by control unit 133'.

Generally, without referring to the embodiment of FIG. 14, a single-beam or multi-beam column has typically at least two focusing elements for each primary electron beam. It is advantageous of the lenses (or at least one) are immersion lenses to allow the electron beam to be on a higher potential (beam boost potential) between the lenses. Further, according to one alternative, a combined gun-condenser lens is preferred for shaping the emitted beam.

For focusing the electron beams on specimen 13, a magnetic electrostatic compound lens 134 for all electron beams is used. Thereby, magnetic sub-lenses share a common excitation coil and for each electron beam an electrostatic sub-lens is integrated in the compound lens. The components of the magnetic electrostatic compound lens are controlled by control unit 134'.

Within FIG. 14, the electrostatic lens 133 and the magnetic electrostatic compound lens 134 are used exemplarily. Instead, two electrostatic-lenses could be used, namely as a condenser lens and as an objective lens. Alternatively, two magnetic electrostatic compound lenses could be used, namely as a condenser lens and as an objective lens. However, it is also possible that no condenser lens is required and only one multi-beam lens is used. Thereby, an electrostatic lens or a magnetic electrostatic compound lens could be used.

Further, a proximity electrode 82 and a respective control unit 82' are provided, whereby an extraction field corresponding to each of the four electron beams is realized. Additionally, for each electron beam 12, electrodes 137 for providing a beam boost potential are provided.

Beyond the above-mentioned components, a deflection-switch system is provided for each electron beam.

Contrary to the magnetic deflection systems shown in FIGS. 3a to 3d, the combination of 4 deflectors allows for an optical axis of the objective lens sub-units that is in common with the optical axis of the emitter sub-units. First deflection stages 14 deflect electron beams 12 to the left or to the right, depending on the kind of aperture used within aperture unit 41. For each electron beam, aperture unit 41 comprises a large aperture for a high current measurement mode and a small aperture for a high resolution measurement mode.

Secondary electrons are separated from the primary electron beams by sectors 425, which are provided for each electron beam. The beam separation of the schematic drawing of FIG. 14 is illustrated within the plane of the figure. This is done for the sake of easier drawing only. Generally, the beam separation and thus, the arrangement of the detection units can also be realized in a dimension orthogonal to the plane of the figure.

For detection of the secondary electrons a focusing and filtering optics 916 is provided. All detection units are controlled by controller 16'/44', whereas each deflection stage 14 is controlled by control unit 14'.

Figure 15:
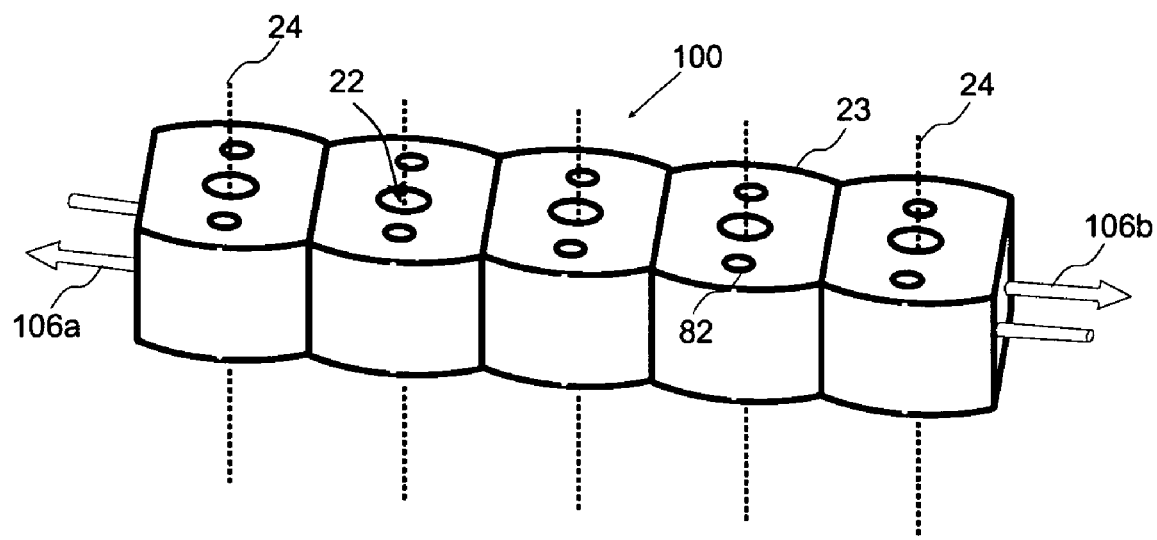
FIG. 15 shows a schematic dimensional view of an objective lens that can be utilized in a multi-beam device according to the invention.

A further embodiment of a multi-beam objective lens will no be described with respect to FIG. 15 originating from European Application Nr. 02 02 8346. Therein, the multi-bore magnetic lens sharing a common excitation coil is amended according to the following.

In the embodiment shown in FIG. 15, five individual lens modules 100 are provided. Each has a magnetically conductive material circuit 23 in the form of a cylinder with two flattened sides. In the middle of the magnetic material circuit, opening 22 is provided. An electron beam traveling along the optical axis 24 through opening 22 is focused by a magnetic lens field. The magnetic lens field is induced by currents 106a and 106b.

The individual lens modules have two planes of symmetry with respect to optical axis 24. In order to maintain the symmetry of the modules, which might partly be distorted by cross talk, there can be a gap in-between each 10 module. Alternatively, such a gap may be filled with a non-magnetic material.

In FIG. 15, the lens modules 100 are manufactured to shape the magnetic flux provided to opening 22. Therefore, additional holes 82 are provided, whereby the magnetic field provided to opening 22 is modified. Making use of the additional holes 82, it is possible to customize the field focusing the electron beam.

With respect to the different multi-lens types shown above, generally for all embodiments, magnetic or combined electrostatic-magnetic lenses may be used. For combined lenses and for electrostatic lenses (in the absence of magnetic lens components) immersion type lenses may be used. Thereby, the impingement energy of the electrons on a specimen can be controlled.

While the foregoing is directed to embodiments of the present invention, other and further embodiments of the invention may be devised without departing from the basic scope thereof, and the scope thereof is determined by the claims that follow.

The invention claimed is:

1. A charged particle unit for deflecting and energy-selecting charged particles of a charged particle beam, comprising:
    a double-focusing sector unit for deflecting and focusing the charged particle beam; and
    an energy-filter forming a potential-saddle, wherein charged particles of the charged particle beam are redirected at the potential-saddle depending on the energy of the charged particles.

2. The charged particle unit of claim 1, wherein the double-focusing sector unit comprises a sector for focusing in a first dimension and a quadrupole unit, cylinder lens or side plates for focusing in a second direction.

3. The charged particle unit of claim 1, wherein the double focusing sector unit comprises a hemispherical sector.

4. The charged particle unit of claim 1, wherein the double-focusing sector unit is adapted to focus the charged particle beam within the energy-filter.

5. The charged particle unit of claim 1, wherein the double focusing sector unit comprises a further lens unit for focusing of the charged particle beam.

6. The charged particle unit of claim 5, wherein the further lens unit comprises an Einzel-lens.

7. The charged particle unit of claim 1, wherein the energy-filter has a biased electrode comprising one aperture for letting pass through the charged particle beam.

8. The charged particle unit of claim 1, wherein the energy-filter is provided in the form of a biased cylinder.

9. The charged particle unit of claim 8, wherein the biased cylinder has a length of at least 100 μm and an aperture diameter of between 100 μm and 20 mm.

10. The charged particle unit of claim 1, wherein the energy-filter is positioned along the direction of propagation approximately at the location of a focus of the charged particle beam.

11. A secondary charged particle detection device comprising:
    a charged particle unit for deflecting and energy-selecting charged particles of a beam of secondary charged particles released from a specimen on impingement of a primary charged particle beam, having a double-focusing sector unit for deflecting and focusing the beam of secondary charged particles and an energy-filter forming a potential-saddle, wherein the secondary charged particles are redirected at the potential-saddle depending on the energy of the charged particles; and
    a detector for producing a detection signal corresponding to the incidence of charged particles having passed through the energy-filter.

12. The device of claim 11, further comprising an acceleration unit for accelerating the secondary charged particle beam.

13. The device of claim 11, further comprising a separating unit for separating the secondary charged particle beam from the primary charged particle beam.

14. The device of claim 13, wherein the separating unit is provided in the form of a magnetic dipole element.

15. The device of claim 13, wherein the separating unit is provided in the form of a Wien filter.

16. An apparatus having one or more charged particle beam devices, each charged particle beam device comprising:
- a charged particle beam source for providing a primary charged particle beam;
- a first focusing element for focusing the primary charged particle beam on a specimen; and
- a secondary charged particle detection device comprising,
  - a charged particle unit for deflecting and energy-selecting charged particles of a beam of secondary charged particles released from a specimen on impingement of the primary charged particle beam, having a double-focusing sector unit for deflecting and focusing the beam of secondary charged particles and an energy-filter forming a potential-saddle, wherein the secondary charged particles are redirected at the potential-saddle depending on the energy of the charged particles, and
  - a detector for producing a detection signal corresponding to the incidence of charged particles having passed through the energy-filter.

17. The apparatus of claim 16, wherein the one or more charged particle devices comprise at least two charged particle devices.

18. The apparatus of claim 17, wherein the charged particle beams are focused by a plurality of first focusing elements integrated in one multi-beam objective lens.

19. The apparatus of claim 17, further comprising, for each primary charged particle beam:
- a multi-aperture unit with at least two aperture openings; and
- wherein an aperture opening of the at least two aperture openings can be selected.

20. The apparatus of claim 16, wherein the one or more charged particle devices comprise at least five charged particle devices.

21. The apparatus of claim 16, wherein the one or more charged particle devices are arranged such that a row of charged particle beams is provided.

22. The apparatus of claim 16, wherein the charged particle beam devices are arranged to provide an array of charged particle beams.

23. The apparatus of claim 16, wherein the charged particle beam source is one of a plurality of charged particle beam sources integrated in one emitter array.

24. A method of deflecting and filtering charged particles, comprising:
- deflecting a first beam of charged particles with a double-focusing sector unit such that the divergence of the charged particles is reduced;
- filtering a portion of the charged particles of the beam with an energy filter, wherein a potential-saddle is provided such that the beam interacts with the potential-saddle; and
- rejecting a portion of the charged particles below an energy threshold value.

25. The method of claim 24, wherein the first beam of charged particles comprises secondary charged particles and the method further comprises:
- separating the first beam of secondary charged particles from a beam of primary charged particles; and
- detecting a portion of the first beam of secondary charged particles above the energy threshold value.

26. The method of claim 25, further comprising:
- accelerating the secondary charged particles with an acceleration unit.

27. The method of claim 25, wherein the focusing is conducted such that a focus is provided in a biased tube of the filter.

* * * * *

UNITED STATES PATENT AND TRADEMARK OFFICE
CERTIFICATE OF CORRECTION

| | | |
|---|---|---|
| PATENT NO. | : 7,335,894 B2 | Page 1 of 1 |
| APPLICATION NO. | : 11/274608 | |
| DATED | : March 27, 2007 | |
| INVENTOR(S) | : Juergen Frosein et al. | |

It is certified that error appears in the above-identified patent and that said Letters Patent is hereby corrected as shown below:

On the title page item [73], insert -- ICT Integrated Circuit Testing Gesellschaft für Halbleiterprüftechnik mbH Heimstetten --

Signed and Sealed this

Seventeenth Day of February, 2009

JOHN DOLL
*Acting Director of the United States Patent and Trademark Office*

UNITED STATES PATENT AND TRADEMARK OFFICE
CERTIFICATE OF CORRECTION

PATENT NO.         : 7,335,894 B2             Page 1 of 1
APPLICATION NO. : 11/274608
DATED              : February 26, 2008
INVENTOR(S)        : Juergen Frosein et al.

It is certified that error appears in the above-identified patent and that said Letters Patent is hereby corrected as shown below:

On the title page item [73], insert -- ICT Integrated Circuit Testing Gesellschaft für Halbleiterprüftechnik mbH Heimstetten --

This certificate supersedes the Certificate of Correction issued February 17, 2009.

Signed and Sealed this

Seventeenth Day of March, 2009

JOHN DOLL
*Acting Director of the United States Patent and Trademark Office*